(12) United States Patent
Raj et al.

(10) Patent No.: US 9,721,650 B1
(45) Date of Patent: Aug. 1, 2017

(54) ARCHITECTURE TO IMPROVE WRITE-ABILITY IN SRAM

(71) Applicant: QUALCOMM Incorporated, San Diego, CA (US)

(72) Inventors: Pradeep Raj, Bangalore (IN); Sharad Kumar Gupta, Bangalore (IN); Rahul Sahu, Bangalore (IN); Lakshmikantha Holla Vakwadi, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/269,620

(22) Filed: Sep. 19, 2016

(51) Int. Cl.
*G11C 11/412* (2006.01)
*G11C 11/419* (2006.01)

(52) U.S. Cl.
CPC .................................. *G11C 11/419* (2013.01)

(58) Field of Classification Search
USPC ........................................................ 365/154
See application file for complete search history.

(56) References Cited

U.S. PATENT DOCUMENTS

| | | | |
|---|---|---|---|
| 7,502,275 B2 | 3/2009 | Nii et al. | |
| 7,898,875 B2 | 3/2011 | Tao et al. | |
| 8,848,461 B2 | 9/2014 | Chang et al. | |
| 8,971,097 B2 | 3/2015 | Ngo et al. | |
| 9,349,438 B2 | 5/2016 | Sano et al. | |
| 2013/0077387 A1* | 3/2013 | Yabuuchi | G11C 11/419 365/154 |
| 2013/0286717 A1 | 10/2013 | Adams et al. | |
| 2015/0255148 A1* | 9/2015 | Roy | G11C 11/4096 365/154 |

* cited by examiner

*Primary Examiner* — Hoai V Ho
*Assistant Examiner* — Minh Dinh
(74) *Attorney, Agent, or Firm* — Arent Fox, LLP and Qualcomm, I

(57) ABSTRACT

A memory and apparatus are disclosed. The memory includes a memory core having a plurality of memory cells. The memory also includes a first write assist circuit configured to assist writing to a first group of the plurality of memory cells of the memory core. Additionally, the memory includes a second write assist circuit configured to assist writing to a second group of the plurality of memory cells of the memory core. The apparatus includes at least one processor. The apparatus also includes a memory array. The memory array includes a memory core having a plurality of memory cells. The memory also includes a first write assist circuit configured to assist writing to a first group of the plurality of memory cells of the memory core and a second write assist circuit configured to assist writing to a second group of the plurality of memory cells of the memory core.

16 Claims, 7 Drawing Sheets

ARCHITECTURE TO IMPROVE WRITE-ABILITY IN SRAM

BACKGROUND

Field

The present disclosure relates generally to memory systems, and more particularly, to systems for writing memories.

Background

Static Random-Access Memory (SRAM) is a type of semiconductor memory. More specifically, SRAM is a type of Random-Access Memory (RAM) that maintains data stored in the SRAM while the memory remains powered. SRAM may not need to be periodically rewritten in order to maintain the data stored as may be required for Dynamic Random-Access Memory (DRAM) (another type of semiconductor memory). SRAM may use bistable latching circuitry, also referred to as a flip-flop, to store each bit of data. The flip-flop may be a pair of cross-coupled inverters. Each cross-coupled inverter may include a pull-up PMOS transistor and a pull-down NMOS transistor.

An SRAM memory cell may be accessed in a read or write operation through a pair of NMOS transistors. If the NMOS access transistors are stronger than the pull-up PMOS transistors a read operation may overwrite the stored memory cell value. If the pull-up PMOS transistors are stronger than the NMOS access transistors, however, the write operation may fail. Write-assist techniques may be used to address the write operation issues. However, the various write assist techniques may not scale well.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. The summary's sole purpose is to present some concepts of one or more aspects in a simplified form as a prelude to the more detailed description that is presented later.

In an aspect of the disclosure, a memory is provided. The memory array includes a memory core having a plurality of memory cells. The memory also includes a first write assist circuit configured to assist writing to a first group of memory cells of the plurality of memory cells of the memory core. Additionally, the memory includes a second write assist circuit configured to assist writing to a second group of other memory cells of the plurality of memory cells of the memory core.

In another aspect of the disclosure, an apparatus is provided. The apparatus includes at least one processor. The apparatus also includes a memory array. The memory array includes a memory core having a plurality of memory cells. The memory also includes a first write assist circuit configured to assist writing to a first group of memory cells of the plurality of memory cells of the memory core and a second write assist circuit configured to assist writing to a second group of other memory cells of the plurality of memory cells of the memory core.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
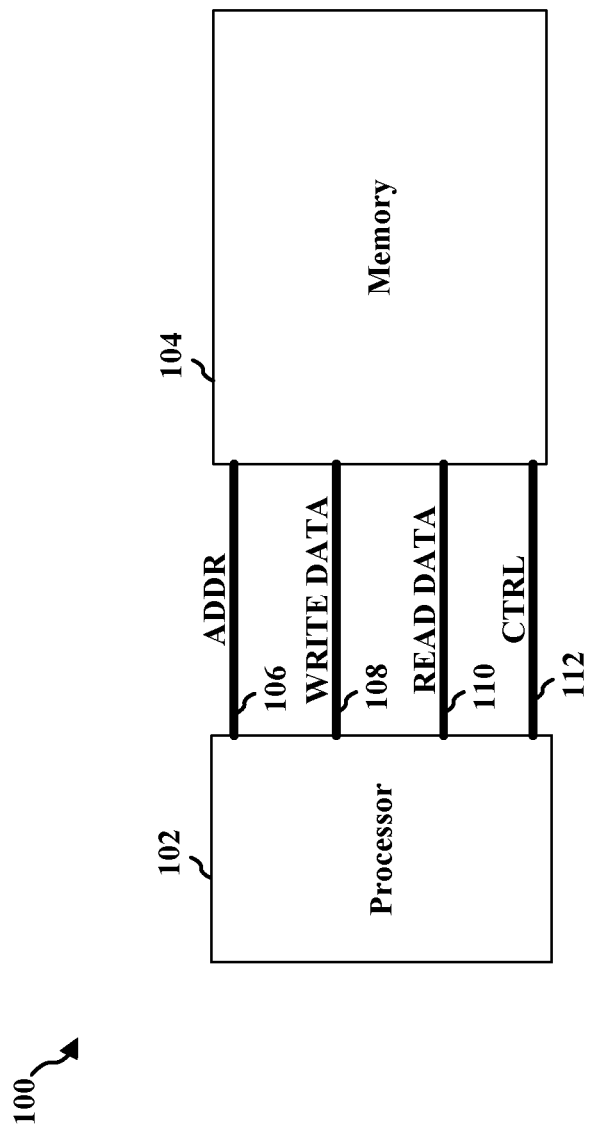
FIG. 1 is a conceptual block diagram illustrating an example of a processing system.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that the concepts may be practiced without these specific details. In some instances, well-known structures and components are shown in block diagram form in order to avoid obscuring such concepts. Acronyms and other descriptive terminology may be used merely for convenience and clarity and are not intended to limit any concept disclosed herein.

Various memories presented throughout the disclosure may be implemented in a stand-alone memory. Such aspects may also be included in an integrated circuit (IC) or a system, or a portion of an integrated circuit or a portion of a system (e.g., modules, components, circuits, or the like residing in an integrated circuit or part of an integrated circuit), or an intermediate product where an integrated circuit or a system is combined with other integrated circuits or systems (e.g., a video card, a motherboard, etc.) or an end product (e.g., mobile phone, personal digital assistant (PDA), desktop computer, laptop computer, palm-sized computer, tablet computer, work station, game console, media player, computer based simulators, wireless communication attachments for laptops, or the like).

The word "exemplary" is used herein to mean serving as an example, instance, or illustration. Any embodiment described herein as "exemplary" is not to be construed as preferred or advantageous over other embodiments. Likewise, the term "embodiment" of an apparatus does not require that all embodiments of the invention include the described components, structure, features, functionality, processes, advantages, benefits, or modes of operation.

The terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements may be physical, logical, or a combination thereof. As used herein, two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not limit the quantity or order of the element. Rather, the designations are used herein as a convenient method of distinguishing between two or more elements or instances of an element. Thus, a reference to first and second elements does not mean that only two elements can be employed, or that the first element must precede the second element. As used herein, references to the plural include the singular, and references to the singular include the plural.

Various aspects of a memory will now be presented in the context of a static random access memory (SRAM). SRAM is volatile memory that retains data while the memory remains powered. However, as those skilled in the art will readily appreciate, such aspects may be extended to other memories and/or circuit configurations. Examples of other memories may include random access memory (RAM), dynamic RAM (DRAM), synchronous dynamic RAM (SDRAM), double data rate RAM (DDRAM), read only memory (ROM), programmable ROM (PROM), erasable PROM (EPROM), electrically erasable PROM (EEPROM), a general register on a processor, flash memory, or any other suitable memory. Accordingly, while SRAM may be used in various examples described herein, references to SRAM are intended to illustrate exemplary aspects of other memory types in addition to SRAM. For example, aspects described with respect to SRAM may be applied RAM, DRAM, SDRAM, DDRAM, ROM, PROM, EPROM, OR EEPROM, to name a few, with the understanding that such aspects may be extended to a wide range of applications.

FIG. 1 is a conceptual block diagram illustrating an example of a processing system 100. The processing system 100 includes a processor 102 and a memory 104. The processor 102 may be a microprocessor, microcontroller, digital signal processor (DSP), programmable logic implementing a processor, or other processing circuitry. The memory 104 may be a multibank memory, such as a synchronous dynamic random access memory (SDRAM), or any other multibank component capable of retrieving and storing information.

The processor 102 illustrated in FIG. 1 is connected to the memory 104. The connections between the processor 102 and the memory 104 may include an address bus 106, a write data bus 108, a read data bus 110, and a control bus 112. The write data bus 108 may be used to write data from the processor 102 to the memory 104. The control bus 112 may include signals used to control the writing of data from the processor 102 to the memory 104. The read data bus 110 may be used to read data from the memory 104 to the processor 102. The control bus 112 may include signals used to control the reading of data from the memory 104 to the processor 102. For example, the control bus 112 may include signals such as a read signal and a write signal. The read signal may be a single signal line, e.g., a single bit, that indicates when the memory is being read by the processor 102. The write signal may be a single signal line that indicates when the memory is being written by the processor 102. In some examples, the control bus 112 may also include a byte enable signal. The byte enable signal may be a group of signal lines that indicate the size of the data, e.g., 8, 16, 32, 64 bytes. In some examples, however, the size of the data may be fixed, e.g., one of 8, 16, 32, 64 bytes. Accordingly, the byte enable signal may be optional on the control bus 112.

Other optional signals that may be part of the control bus 112 may include, but are not limited to, transfer acknowledgment (ACK), bus request, bus grant, interrupt request, one or more clock signals, and a reset signal. The transfer acknowledge signal may indicate that data is acknowledged by a device, e.g., the processor 102, as having been read. The bus request may indicate that a device, e.g., the processor 102 or the memory 104 is requesting the bus, e.g., the processor 102 or the memory 104 is requesting use of the address bus 106 and one of the write data bus 108 or the read data bus 110. The bus grant may indicate that the processor 102 has granted access to the bus. The interrupt request may indicate to the processor 102 that a lower priority device is requesting the bus. Any clock signals on the control bus 112 may be used to synchronize devices on the control bus 112 such as the processor 102, the memory 104, or both. The reset may be used to reset the processor 102, the memory 104, or both. The signals described above as optional may not be used in the example systems described herein, but may be used in particular implementations of the systems and methods described.

The control bus 112 may include a read signal and a write signal. The read signal and the write signal may be used to generate a read enable and a write enable, respectively, within the memory 104 as will be discussed in greater detail with respect to FIG. 3.

The address bus 106 may be used to indicate which location within the memory 104 the processor is reading or writing. For example, if the processor 102 wishes to read a memory location in the memory 104 the processor 102 may output the address of the memory location on the address bus 106. Additionally, the processor 102 may drive the read signal, which may be part of the control bus 112, active. The memory 104 may then output the data in the memory location indicated by the address bus 106 on the read data bus 110. Similarly, if the processor 102 wishes to write a memory location in the memory 104, the processor may output the address of the memory location to be written on the address bus 106. Additionally, the processor 102 may drive the write signal, which may be part of the control bus 112, active. The processor 102 may drive the write data bus 108 with the data that is to be written to the memory 104.

The write data bus 108 and the read data bus 110 are illustrated as separate buses in FIG. 1. In other examples, a single bidirectional data bus may be used to write data from the processor 102 to the memory 104 and to read data from the memory 104 to the processor 102. Systems using a single bidirectional data bus may be used to write data from the processor 102 to the memory 104 and to read data from the memory 104 to the processor 102 may include various control signals to allow for the use of a single bidirectional data bus, such as a read/write signal and a data valid signal. The read/write signal may indicate when data is being read or written. The data valid signal may indicate if data on the bidirectional data bus is valid data.

Figure 2:
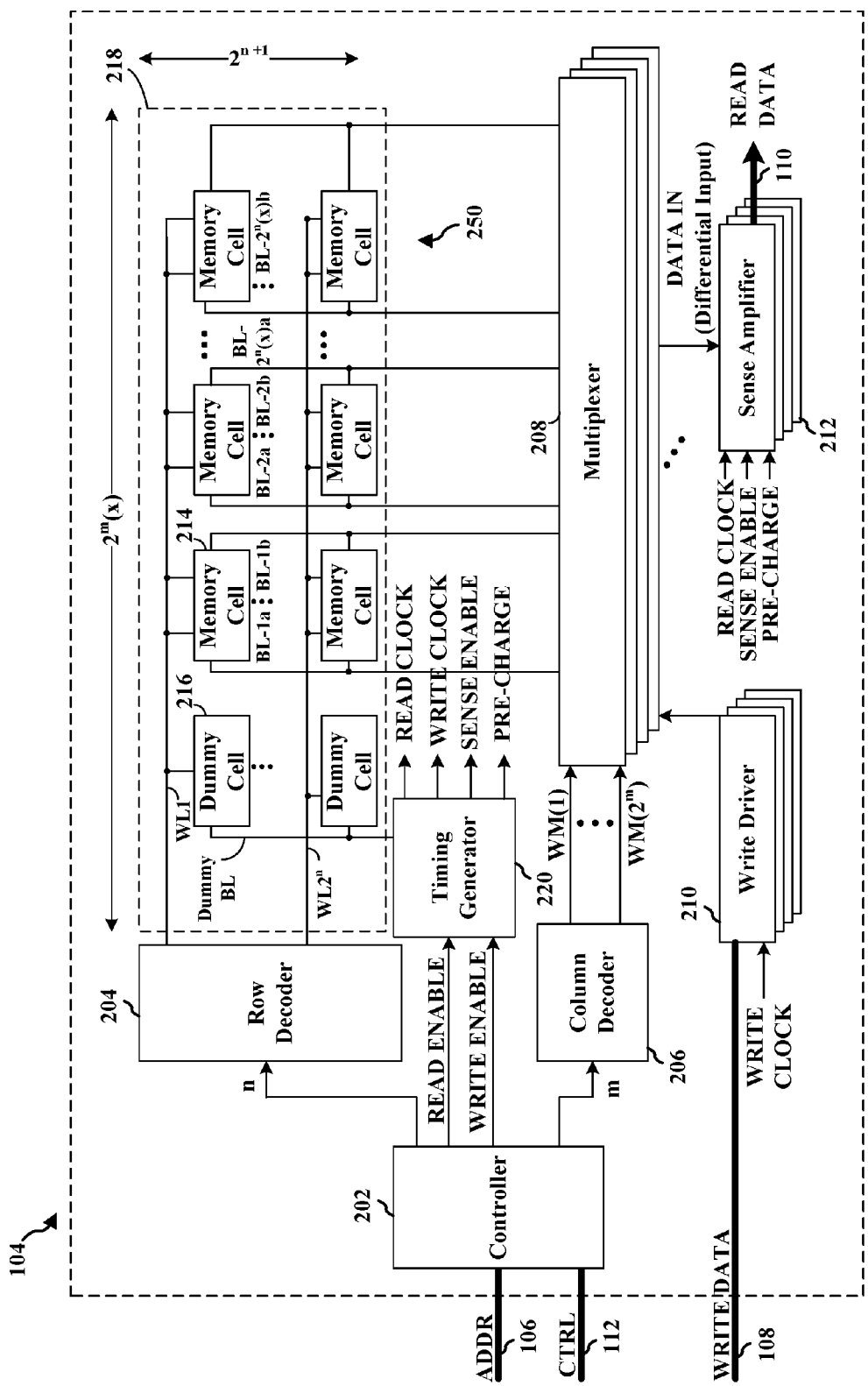
FIG. 2 is a functional block diagram of an exemplary embodiment of an SRAM.

FIG. 2 is a functional block diagram of an exemplary embodiment of a memory 104. The memory 104 may be a static random-access memory (SRAM). The memory 104 may include a memory array 218 with supporting circuitry to decode addresses and perform read and write operations. The memory array 218 may include memory cells 214 for storing data. For example, the memory cell 214 may be a bit cell storing a bit of data. Accordingly, a memory cell such as memory cell 214 in memory 104 may provide a means for storing a first bit. Similarly, another memory cell may provide a means for storing a second bit.

The memory cells 214 may be arranged in columns 250 and may be arranged to share connections in horizontal rows and vertical columns. Specifically, each horizontal row of memory cells 214 may share a wordline WL, and each vertical column of memory cells 214 may share a pair of bitlines (e.g., BL-1$a$ and BL-1$b$). The size of the memory array 218 (e.g., the number of cells) may vary depending on a variety of factors including the specific application, the speed requirements, die layout constraints and testing requirements, and the overall design constraints imposed on the system. The memory array 218 may contain thousands or millions of memory cells.

In the exemplary embodiment of the memory 104 shown in FIG. 2, the memory array 218 may include ($2^n \cdot 2^m(x)$) memory cells 214 arranged in $2^n$ horizontal rows and $2^m(x)$ vertical columns, where $2^m$ is the number of words per row and x is the number of bits per word. A peripheral device (not shown) may randomly access any word (i.e., x cells) in the memory array 218 using an (n+m) bit wide address that is provided through a controller 202 to a row decoder 204 and column decoder 206, respectively. As will be described in greater detail later, the controller 202 may be responsible for the memory read and write operations. For example, the controller may provide the timing for the read and write operations in memory cycles. The output from the controller 202 may include an n-bit address provided to the input of a row decoder 204, and an m-bit address provided to the input of a column decoder 206. The column decoder 206 provides $2^m$ outputs (WM(1)-WM($2^m$)) with a different one of the outputs asserted for each different combination of address inputs.

The outputs are provided to x multiplexers 208. For a write memory access, each multiplexer is a $2^m$:1 multiplexer which switches one of x inputs from a write driver 210 between $2^m$ bitline pairs based on the outputs from the column decoder 206. By way of example, a memory array that stores four (4) 128-bit words per row requires 128 4:1 multiplexers. Each multiplexer input is coupled to, for example, one of 128 outputs from the write driver 210. Based on the decoded m-bit address, each multiplexer input may be coupled from the write driver 210 to one of 4 bitline pairs. The 4 bitline pairs may be coupled to four memory cells, each storing a corresponding bit for a different word in a row. For example, the first of the 4 memory cells may store the least significant bit (LSB) of the first word, the second of the 4 memory cells may store the LSB of the second word, the third of the 4 memory cells may store the LSB of the third word, and the fourth of the 4 memory cells may store the LSB of the fourth word.

Thus, when the WRITE ENABLE signal from the controller 202 is asserted, the write driver 210 outputs the Write Data received from the peripheral device (not shown) to x pairs of bitlines BL-a and BL-b with each of the x multiplexers driving one pair of bitlines (e.g., BL-1$a$ and BL-1$b$). The row decoder 204 converts the n-bit address into $2^n$ wordline outputs. A different wordline WL is asserted by the row decoder 204 for each different n-bit row address. As a result, each of the $2^m(x)$ memory cells 214 in the horizontal row with the asserted wordline WL is connected to one pair of the $2^m(x)$ bitlines (e.g., BL-1$a$ and BL-1$b$) through each memory cells 214 access transistors, as will be described in more detail below with reference to FIG. 3. The write data is driven, through the x multiplexers 208, onto the selected pairs of bitlines (e.g., BL-1$a$ and BL-1$b$) and written to the memory cells with the asserted wordline WL.

For a read memory access, the row decoder 204 converts the n-bit address into one of the $2^n$ read wordlines. A different read wordline WL is selected by the row decoder 204 for each different n-bit row address. As a result, each of the $2^m(x)$ memory cells in the horizontal row with the selected read wordline WL is connected to one of the $2^m(x)$ read bitlines BL through the memory cell's access transistor, as will be described in more detail below with reference to FIG. 3. The $2^m(x)$ read bitlines BL are used to transmit the bits stored by the $2^m(x)$ memory cells to the x multiplexers 208, with each multiplexer 208 selecting one bit from the $2^m$ bits transmitted on the read bitlines BL to the input of that multiplexer 208. The selected bits from the x multiplexers 208 are provided to the sense amplifier 212 for outputting the read data signal 110. Accordingly, a sense amplifier, such as the sense amplifier 212 in memory 104 may provide a means for generating a first data bit output as a function of the first bit when a first read enable is active. Another sense amplifier may provide a means for generating a second data bit output as a function of the first bit when a first read enable is active. After the READ ENABLE signal generated by the controller 202 is asserted, the selected bits are ready for the sense amplifier 212. The READ ENABLE from the controller 202 may be used to generate the READ CLOCK. Additionally, the controller 202 may generate the n and m signals for the row and column decoders, respectively. Data from the multiplexer 208 into the sense amplifier 212 (DATA IN) may be available after the bitline BL and the wordline WL are selected, e.g., based on the n and m signals, and after the READ CLOCK is generated. Generally, there may be a delay from when the bitline BL and the wordline WL and the READ CLOCK are selected and when data from the multiplexer 208 into the sense amplifier 212 (DATA IN) is available because accessing the memory and propagating through the multiplexer 208 may take time.

As mentioned earlier, the controller 202 is responsible for memory operations by providing the timing for the read and write operations in a memory cycle. The memory cycle may be defined by the SYSTEM CLOCK input to the controller 202. The timing of the read and write operation is derived from internal READ and WRITE CLOCKS that are used to respectively multiplex READ and WRITE ADDRESS inputs from a peripheral device to the address decoder (i.e., row decoders 204 and column decoders 206). The READ clock is set by the READ ENABLE and reset by the READ CLOCK RESET. Similarly, the WRITE CLOCK is set by the WRITE ENABLE once the read operation is complete and reset by the WRITE CLOCK RESET. The READ and WRITE ENABLES may be input to the controller 202 from a peripheral device and controlled by the peripheral device. The READ CLOCK and WRITE CLOCK RESET may be generated by a tracking circuit in the memory array 218 and input to the controller 202. The READ ENABLE may be used to generate the READ CLOCK. The WRITE ENABLE may be used to generate the WRITE CLOCK. The READ CLOCK may be generated by the timing generator 220. The timing generator 220 may be configured to control the timing of the READ CLOCK so that the sense amplifier 212 is active when the DATA IN signal(s) are valid. Similarly, the timing generator 220 may be configured to control the timing of the WRITE CLOCK so that the Write Driver 210 is active when the DWRITE DATA signal(s) are valid.

As used herein, the terms "set" and "reset" with respect to a clock or other signal may describe two different logic states of such clock or other signal regardless of polarity. By way of example, a clock or other signal may be described as having a high logic state (e.g., a logic level "1") when set and a low logic state (e.g., logic "0") when reset. Alternatively, the clock or other signal may be described as having a low logic state when set and a high logic state when reset, as might be the case with an inverted clock or signal. Accordingly, the terms "set" and "reset" as used herein may have no defined polarity, but rather should be construed broadly to mean different logic states with reference to one another.

In the described exemplary embodiment, the tracking circuit may include a column of dummy cells, e.g., such as the example dummy cell 216, in the memory array. Dummy cells, such as dummy cell 216, may be used to determine when data from a memory cell, such as memory cell 214, is valid. Each dummy cell 216 may be configured to emulate the operation of a row of memory cells 214. Each dummy cell 216 is connected to the same WL for the dummy cell's 216 row of memory cells 214. (Accordingly, there may be a dummy cell for each row so that each row may be monitored based on that row's dummy cell, e.g., dummy cell 216.) The timing generator 220 may be used to monitor the dummy bit line (BL) from the corresponding dummy cell 216 connected to the asserted WL. Specifically, the timing generator 220 may monitor the dummy BL and compare a voltage on the dummy BL to a threshold to track the access time of the selected memory cell 214 during read and/or write operations.

By way of example, during a read operation, the timing generator 220 monitors the dummy BL and may reset the READ CLOCK when a known bit stored in the dummy cell 216 appears on the dummy BL. (For example, the timing generator 220 may monitor the dummy BL to determine when the dummy BL changes from one logic state (e.g., a logic 1 state) to another logic state (e.g., a logic 0 state). The change in logic state may indicate that data on the corresponding memory cell bit lines is valid.) Similarly, during a write operation, the timing generator 220 monitors the dummy BL and resets the WRITE CLOCK when a known bit written to the dummy cell by the write driver 210 appears on the dummy BL. (For example, the timing generator 220 may monitor the dummy BL to determine when the dummy BL changes from one logic state to another logic state. The change in logic state may indicate that data on the corresponding memory cell bit lines is valid.) In at least one exemplary embodiment, the timing generator 220 may also be used to generate a WRITE READY signal. The WRITE READY signal may be used by the controller to satisfy certain internal timing constraints of the write operation following the read operation. Each memory cell 214 may be configured to store one bit of data (e.g., a logic level "1" or a logic level "0").

Figure 3:
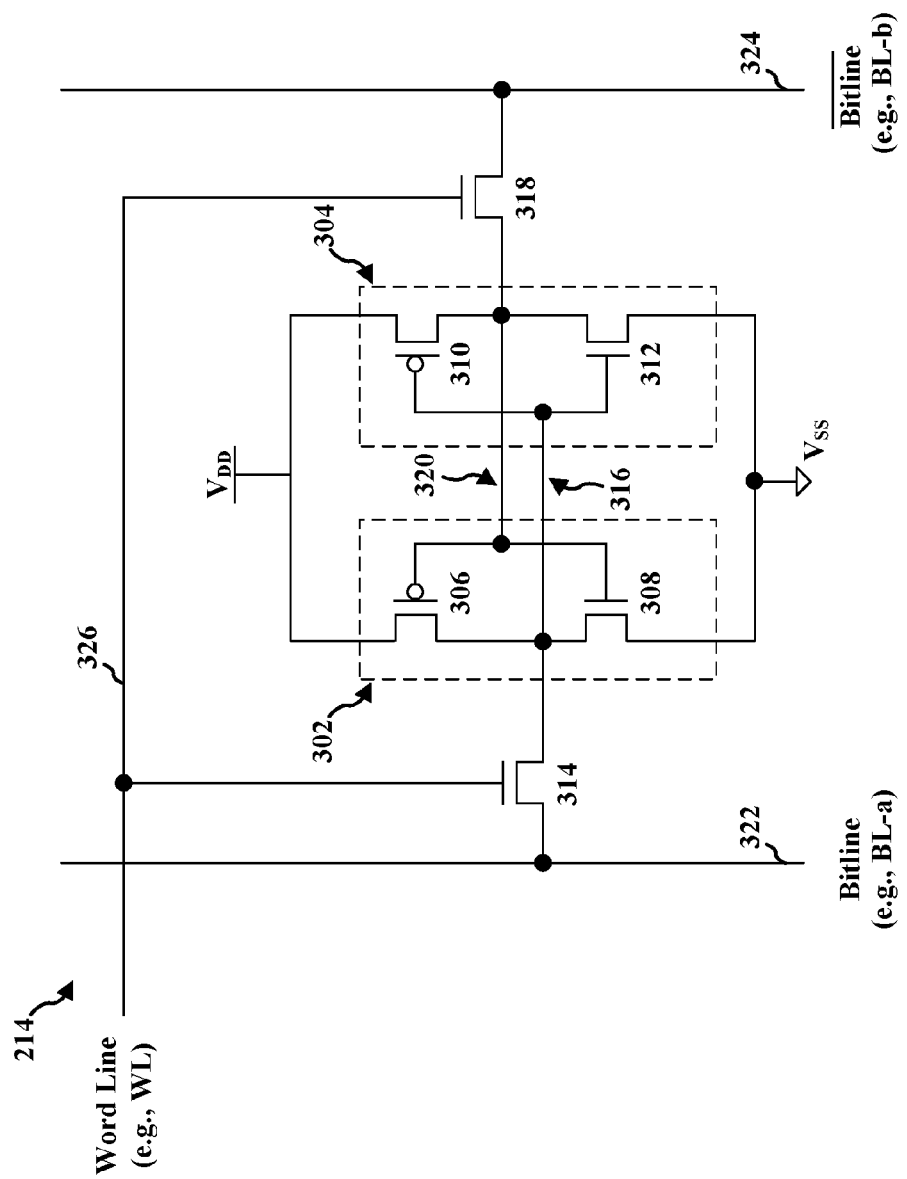
FIG. 3 is a schematic diagram of an exemplary embodiment of a memory cell for a SRAM.

FIG. 3 is a schematic diagram of an exemplary embodiment of the memory cell 214 of FIG. 2 of the memory 104 of FIG. 2. The memory cell 214 illustrated in FIG. 3 is a six-transistor (6T) configuration. However, as those skilled in the art will readily appreciate, the memory cell 214 may be implemented with a four-transistor (4T) configuration, an eight transistor (8T) configuration, a ten transistor (10T) configuration, or any other suitable transistor configuration that may be used to implement a memory cell.

The memory cell 214 is shown with two inverters 302, 304. The first inverter 302 includes a p-channel metal-oxide-semiconductor field effect (PMOS) pull-up transistor 306 and an n-channel metal-oxide-semiconductor field effect (NMOS) 308. The second inverter 304 includes a PMOS pull-up transistor 310 and an NMOS transistor 312. In the described embodiment, the inverters 302 and 304 are powered by VDD and have a return VSS (e.g., ground). The first inverter 302 and the second inverter 304 are interconnected to form a cross-coupled latch. A first NMOS access transistor 314 couples the input to the second inverter 304 (node 316) to a bitline BL-a 322, and a second NMOS access transistor 318 couples the output node 320 from the first inverter 302 to a bitline BL-b 324 (the value of which is the opposite or inverse of the bitline 322). The gates of the NMOS access transistors 314, 318 are coupled to a wordline WL 326.

A write operation may be performed by setting the bitlines BL-a 322 and BL-b 324 to the value to be written to the memory cell 214 and asserting the wordline WL 326. The wordline WL 326 may be asserted before the value to be written (e.g., write data) is provided to the bitlines BL-a 322 and BL-b 324. By way of example, a low value, e.g., a logic level "1" may be written to the memory cell 214 by setting the bitline BL-a 322 to a logic level 0 and the bitline BL-b 324 to a logic level "1." The logic level 0 at the bitline BL-a 322 is applied to the inverter 304 through the NMOS access transistor 314, which in turn forces the output node 320 of the second inverter 304 to VDD. The output node 320 of the second inverter 304 is applied to the input of the first inverter 302, which in turn forces the output node 316 of the first inverter 302 to VSS. A logic level 0 may be written to the memory cell 214 by inverting the values of the bitlines BL-a 322 and BL-b 324. The write driver 210 may be designed to be stronger than PMOS pull-up transistors (306 and 310) in the memory cell 214 so that the write driver 210 can override the previous state of the cross-coupled inverters 302, 304.

Once the write operation is complete, the wordline WL 326 is de-asserted, thereby causing the NMOS access transistors 314 and 318 to disconnect the bitlines BL-a 322 and BL-b 324 from the two inverters 302, 304. The cross-coupling between the two inverters 302, 304 maintains the state of the inverter outputs as long as power is applied to the memory cell 214.

The memory cell 214 stores data according to the data values stored at nodes 316 and 320. If the memory cell 214 stores a logic high (i.e., a '1'), then node 316 is at a logic high and node 320 is at a logic low (i.e., a '0'). If the memory cell 214 stores a logic low, then node 316 is at a logic low and node 320 is at logic high. During a read operation, differential bit lines BL-1a and BL-1b may be pre-charged by a pre-charge circuit. The wordline WL 326 is then asserted, thereby turning on NMOS access transistors 314, 318. The timing between the pre-charging and asserting the wordline WL 326 may be controlled by the row decoder 204.

If memory cell 214 stores a logic high, then bit line BL-1a remains charged via NMOS access transistor 314, and complimentary bit line BL-1b is discharged via NMOS access transistor 318. If memory cell 214 stores a logic low, then bit line BL-1a is discharged via NMOS access transistor 314, and complimentary bit line BL-1b remains charged via NMOS access transistor 318.

One factor in writing a bit-cell relates to the relative sizing of the pull-up devices to pass-gate devices. The sizing of the pull-up devices to pass-gate devices may impact a write operation. For examples, when writing a bit-cell, such as memory cell 214, the relative sizing of pull-up devices, e.g., PMOS pull-up transistors 306, 310, relative to pass-gate devices, e.g., NMOS access transistors 314, 318, may impact a write operation. In certain device technologies, the pass-gate devices may be stronger than the pull-up devices. In other words, in certain device technologies, the pass-gate devices, e.g., NMOS access transistors 314, 318, may be capable of providing more current than the pull-up devices, e.g., PMOS pull-up transistors 306, 310.

With the advent of certain device technologies, the dynamics between pass-gate devices, NMOS access transistors 314, 318, and pull-up devices, e.g., PMOS pull-up transistors 306, 310, has changed. For example, the low voltage operation, read stability, quantized sizes (fin based) and denser core-cell in 14 nm and lower FinFET technology may change the dynamics between pass-gate devices, NMOS access transistors 314, 318, and pull-up devices, e.g., PMOS pull-up transistors 306, 310. In other words, while previous technologies may have pass-gate devices, NMOS access transistors 314, 318, that are capable of providing more current than the pull-up devices, in FinFET technology, the sizes of the pull-up device and the pass-gate device may be equal. Accordingly, the pass-gate devices may be capable of providing approximately the same current as the pull-up devices, e.g., PMOS pull-up transistors 306, 310, in the FinFET technologies. Having the pass-gate devices provide approximately the same current as the pull-up devices, e.g., PMOS pull-up transistors 306, 310, may impact performance of a write operation. Accordingly, a successful write operation may be a concern in FinFET technology.

Write assist techniques include Negative Bitline Level (NBL) and other techniques to assist writing to a memory, such as an SRAM memory. NBL may be used to assist a write operation into an SRAM bitcell such as memory cell 214. NBL is a write assist technique for SRAM arrays. With NBL, the write features of the memory cell 214 may be improved by applying a negative voltage to one of the bitlines, e.g., BL-a, BL-b, in the memory cell 214 while another bitline, e.g., BL-b, BL-a, is connected to a boosted voltage. Write operations may be improved due to the boosting scheme from both sides of the memory cell 214. NBL may be applied to various types of SRAM cells, such as 6T-SRAM cells, 8T-SRAM cells, 9T-SRAM cells, and a 10T-SRAM cells. (FIG. 3 illustrates a memory cell 214 that is a 6T-SRAM cell. However, the systems and methods described herein may be applied to other types of SRAM memory cells.) NPL may provide faster write time and/or improved write margins compared to other SRAM cells without NBL.

Figure 4:
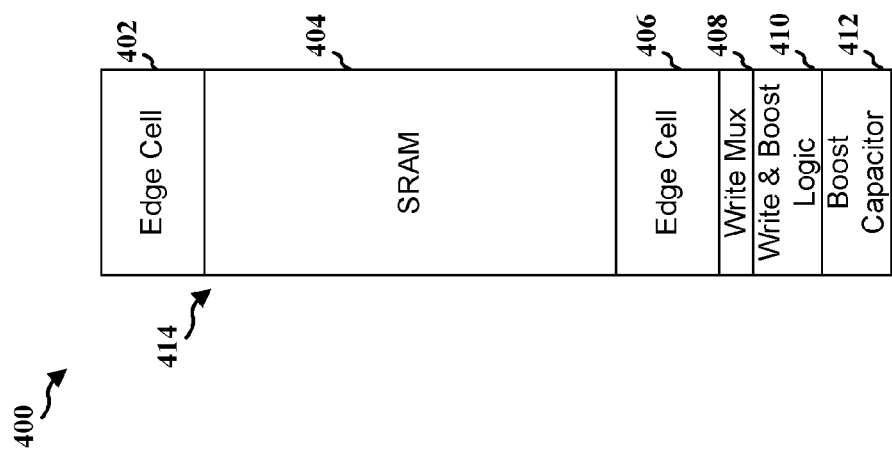
FIG. 4 illustrates an example memory.

FIG. 4 illustrates an example memory 400 including an edge cell 402, an array of SRAM memory cells 404, an edge cell 406, a write multiplexer 408, write and boost logic 410, and a boost capacitor 412. The array of SRAM memory cells 404 may be the same or similar to the memory cell 214 of FIG. 3. In other examples, the array of SRAM memory cells 404 may be 6T-SRAM cells, 8T-SRAM cells, 9T-SRAM cells, or 10T-SRAM cells. The edge cells 402, 406 may be cells used to terminate the array of SRAM memory cells 404. For example, the edge cells 402, 406 may be cells at either end of the array of SRAM memory cells 404. The write multiplexer 408 may be the same or similar to multiplexer 208. The write and boost logic 410 may be within a write driver, such as the write driver 210 illustrated in FIG. 2. The boost capacitor 412 may provide current needed to perform a write operation.

SRAM cells, e.g., memory cells 214, within the array of SRAM memory cells 404 may use NBL. For NBL, a boost may be generated to an Input/Output (I/O), e.g., at a bitline BL-a, BL-b. The boost may be generated at one end. For example, the write and boost logic 410 illustrated in FIG. 4 is at one end of the memory 400.

In 14 nm to 10 nm manufacturing processes, a 1.8× to 4× increase in resistance along the bitline BL-a, BL-b, may occur. A similar trend in increased resistance along bitlines is expected as device sizes decrease. A far end set of memory cells 214 located at an end 414 may have a higher resistance along the bitline from the write and boost logic 410 to the memory cell 214 as compared to memory cells 214 that are closer to the write and boost logic 410. Accordingly, A far end set of memory cells 214 located at an end 414 may increase a boost required for NBL. The boost generation of the IO of the far end set of memory cells 214 located at the end 414 may need to be increased because the resistive loads along the bitline to the far end set of memory cells 214 located at the end 414 may have the highest resistance. High boost generation may lead to a need for a boost capacitor 412 having higher capacitance. A boost capacitor 412 having higher capacitance may be larger in size. Accordingly, the boost capacitor 412 in devices may result in an area penalty due to an increased area for the boost capacitor 412. Additionally, high boost generation and repetitive boost generation in each write cycle may decrease MOSFET device reliability. The memory 400 architecture may be inadequate to meet the negative boost requirement at lower operating voltage in 14 nm to 10 nm processes as well as smaller device feature processes. In other words, the memory 400 architecture may be inadequate to discharge a bit line to a voltage level below (e.g., negative) the nominal low supply rail value (e.g., ground).

Figure 5:
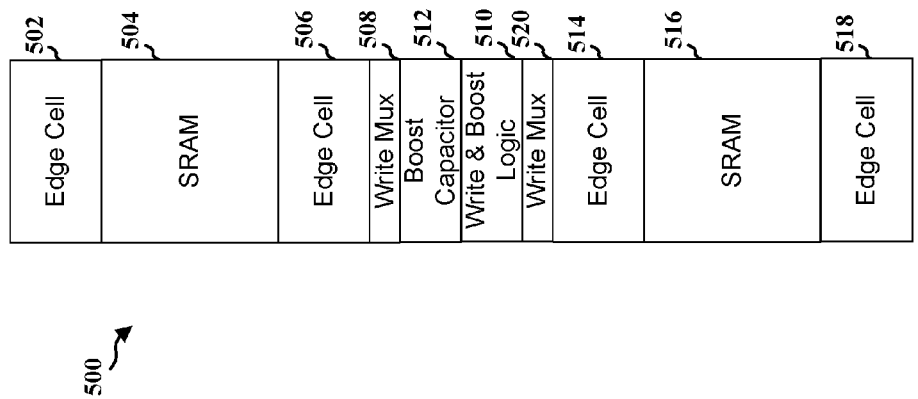
FIG. 5 illustrates another example memory.

FIG. 5 illustrates an example memory 500 including an edge cell 502, an array of SRAM memory cells 504, an edge cell 506, a write multiplexer 508, a boost capacitor 512, write and boost logic 510, a write multiplexer 520, an edge cell 514, the array of SRAM memory cells 516, and an edge cell 518. The array of SRAM memory cells 504, 516 may include memory cells that are the same or similar to the memory cell 214 of FIG. 3. In other examples, the array of SRAM memory cells 404 may be 6T-SRAM cells, 8T-SRAM cells, 9T-SRAM cells, or 10T-SRAM cells. The edge cells 502, 506, 514, 518 may be cells used to terminate the array of SRAM memory cells 504, 516. For example, the edge cells 502, 506, may terminate the array of SRAM memory cells 504. The edge cells 514, 518 may be cells used to terminate the array of SRAM memory cells 516. The write multiplexer 508 may be the same or similar to multiplexer 208. The write and boost logic 510 may be within a write driver, such as the write driver 210 illustrated in FIG. 2. The boost capacitor 512 may provide current needed to perform a write operation. The example memory 500 of FIG. 5 may have lower resistive loads along the bitlines to the farthest memory cells in the arrays of SRAM memory cells 504, 516 because each array of SRAM memory cells 504, 516 may have shorter bitlines when compared to the bitlines of the array of SRAM memory cells 404 of FIG. 4. The memory 500 of FIG. 5 may use a larger die area for the same number of memory cells, however. For example, assuming the total number of memory cells in the memory cells 400 is the same as the number of memory cells in the memory 500, the die area of the memory 500 will generally be greater than the die area of the memory 400. The area of the memory 500 may be greater than the area of the memory 400 because the memory 500 includes twice as many edge cells 502, 506, 514, 518, e.g., four instead of two edge cells, as well as an additional write multiplexer 520 (in addition to the write multiplexer 508).

Figure 6:
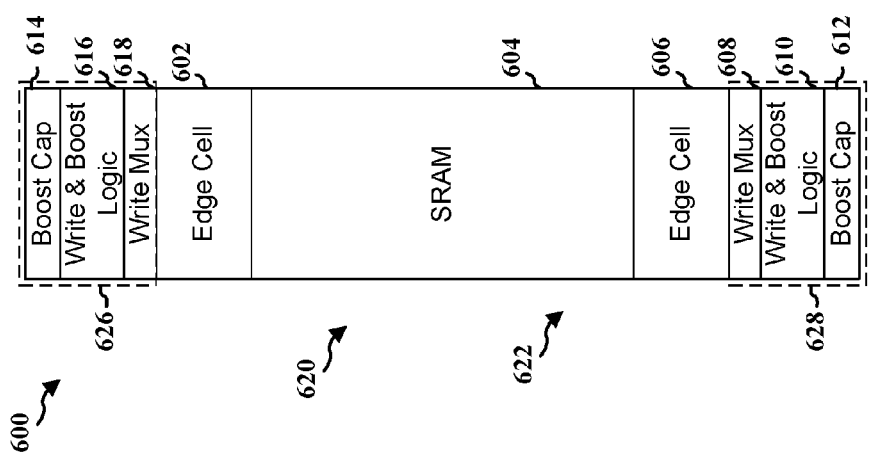
FIG. 6 illustrates another example memory.

FIG. 6 illustrates an example memory 600 including boost logic within write and boost logic 610, 616. In the example memory 600, the boost logic is implemented at both ends of the bitlines, e.g., the extreme ends of the bitlines (the ends of the bitlines from which the bitlines are driven). Implementing the boost logic at both ends of the bitlines may shorten the signal path between individual memory cells in the array of SRAM memory cells 604 and the boost logic within write and boost logic 610, 616.

The example memory 600 also includes an edge cell 602, an edge cell 606, a write multiplexer 608, a boost capacitor 612, a boost capacitor 614, and a write multiplexer 618. The array of SRAM memory cells 604 may include memory cells that are be the same or similar to the memory cell 214 of FIG. 3. In other examples, the array of SRAM memory cells 604 may be 8T-SRAM cells, 9T-SRAM cells, or 10T-SRAM cells. The edge cells 602, 606 may be cells used to terminate the array of SRAM memory cells, e.g., at the end of a column of the array of SRAM memory cells 604. For example, the edge cells 602, 606 may be cells at either end of the array of SRAM memory cells 604. The write multiplexers 608, 618 may be the same or similar to multiplexer 208. The write and boost logic 610 may be within a write driver, such as the write driver 210 illustrated in FIG. 2. The boost capacitors 612, 614 may provide current needed to perform a write operation.

The array of SRAM memory cells 604, e.g., memory cells 214, may use NBL. For NBL, a boost may be generated to an I/O circuit, e.g., a bitline BL-a, BL-b, of the array of SRAM memory cells 604. The boost may be generated at either end of the memory 600. By generating the boost at either end of the memory 600, the resistive losses may be decreased. The resistive losses may be decreased because the distance traveled between the generation of the boost on the bitlines and the particular memory cell of the array of SRAM memory cells 604 being accessed may be decreased. Furthermore, unlike the example memory 500 of FIG. 5, which has four sets of edge cells 502, 506, 514, 518, the example memory 600 of FIG. 6 may only have two sets of edge cells 602, 606. Accordingly, while the example memory 600 may be larger, e.g., have a larger die area, as compared to the example memory 400, the example memory 600 may be smaller, e.g., in die area, than the example memory 500 while having shorter distances between a memory cell in the array of SRAM memory cells 604 and the closest write and boost logic 610, 616 when compared to the memory 400. Having a shorter distances between a memory cell in an array of SRAM memory cells 604 and the closest write and boost logic 610, 616 reduces the resistance of the bitline along the shorter path. Reducing the resistance of the bitline along the shorter path decreases the boost required.

As discussed above, in the example memory 600, the boost logic (within write and boost logic 610, 616) may be implemented at both ends of the bitlines. For one portion 620 (e.g., an upper half) of the array of SRAM memory cells 604, the write and boost logic 616 may be active when performing a write to portion 620. For another portion 622 (e.g., a lower half) of the array of SRAM memory cells 604, the write and boost logic 610 may be active when performing a write operation to portion 622. Activating the write and boost logic 610 for the portion 622 of the array of SRAM memory cells 604 and activating the write and boost logic 616 for the portion 620 of the array of SRAM memory cells 604 may reduce the resistance of the bitline by approximately one half. Reducing the resistance of the bitline may also scale down the boost generation requirement proportionately when compared to memories having longer bitlines paths and hence reduce the boost capacitor size when compared to the boost capacitor size of memories having longer bitlines paths. Accordingly, the boost capacitors 612, 614 may be smaller in capacitance and may take up less die area in some examples.

The example memory 600 may have an area penalty of approximately 1.7% due to repetition of the write and boost logic 610, 616. A 1.7% area penalty may be acceptable in many cases. Accordingly, the memory 600 may reduce the bitline resistance by approximately one half (between the write and boost logic 610, 616 and a memory cell being written by the particular write and boost logic 610, 616), as compared to the bitline resistance of the example memory 500, but without the die area impact of the example memory 500 of FIG. 5, e.g., because of the use of fewer edge cells 602, 606 as compared to the example memory 500 of FIG. 5 (edge cells 502, 506, 514, 518).

Additionally, the architecture of the example memory 600 may reduce loss due to "negative boost." A negative boost is an approach to improve write performance of SRAM devices. The "negative boosting" discharges a bit line to a voltage level below the nominal low supply rail value (e.g., ground). Discharging a bit line to a voltage level below the nominal low supply rail value causes the pass gates of an SRAM cell coupled to the discharged bit line to have a gate-to-source voltage increase and a drain-to-source voltage increase. Reducing losses due to negative boost may improve efficiency of an SRAM memory and produce higher yields. Additionally, reduction in boost generation may decrease the risk to device reliability caused by having higher boost generation and repetitive boost generation. Because the negative voltage level on a bitline used in the example memory 600 due to a decrease in resistance may be comparatively less than the negative voltage level on a bitline used in the example memory 400 due to higher resistance, dynamic power dissipation may also be decreased.

The example memory 600 includes a memory core (e.g., the array of SRAM memory cells 604) having a plurality of memory cells. The memory cells (e.g., memory cells 214) of the memory core may be 6T-SRAM cells, 8T-SRAM cells, 9T-SRAM cells, 10T-SRAM cells, or other types of SRAM memory cells. A first write assist circuit 626 (e.g., boost capacitor 614, write and boost logic 616, and write multiplexer 618) may be configured to assist writing during a write operation to a first group of the memory cells (e.g., the portion 620). For example, when a memory cell (214) in a portion 620 of the array of SRAM memory cells is addressed, the first write assist circuit 626 (e.g., boost capacitor 614, write and boost logic 616, and write multiplexer 618) may assist writing during a write operation to a first group of the memory cells (e.g., the portion 620). Conversely, when a memory cell (214) in a portion 622 of the array of SRAM memory cells is addressed, the second write assist circuit 628 (e.g., boost capacitor 612, write and boost logic 610, and write multiplexer 608) may assist writing data during a write operation to the second group of the memory cells (e.g., the portion 622).

A second write assist circuit 628 (e.g., boost capacitor 612, write and boost logic 610, and write multiplexer 608) may be configured to assist writing during a write operation to a second group of the memory cells (e.g., the portion 622). The first write assist circuit 626 (e.g., boost capacitor 614, write and boost logic 616, and write multiplexer 618) and the second write assist circuit 628 (e.g., boost capacitor 612, write and boost logic 610, and write multiplexer 608) may be located on opposite sides of the memory core (e.g., the array of SRAM memory cells 604). A first edge circuit or edge cell (e.g., edge cell 602) may be between the first write assist circuit 626 (e.g., boost capacitor 614, write and boost logic 616, and write multiplexer 618) and the memory core (e.g., the array of SRAM memory cells 604) and a second edge circuit or edge cell (e.g., edge cells 606) may be between the second write assist circuit 628 (e.g., boost capacitor 612, write and boost logic 610, and write multiplexer 608) and the memory core (e.g., the array of SRAM memory cells 604), as illustrated in FIG. 6. In an example, the edge cells may be at each end of a column of cells forming the array of SRAM memory 604

Figure 7:
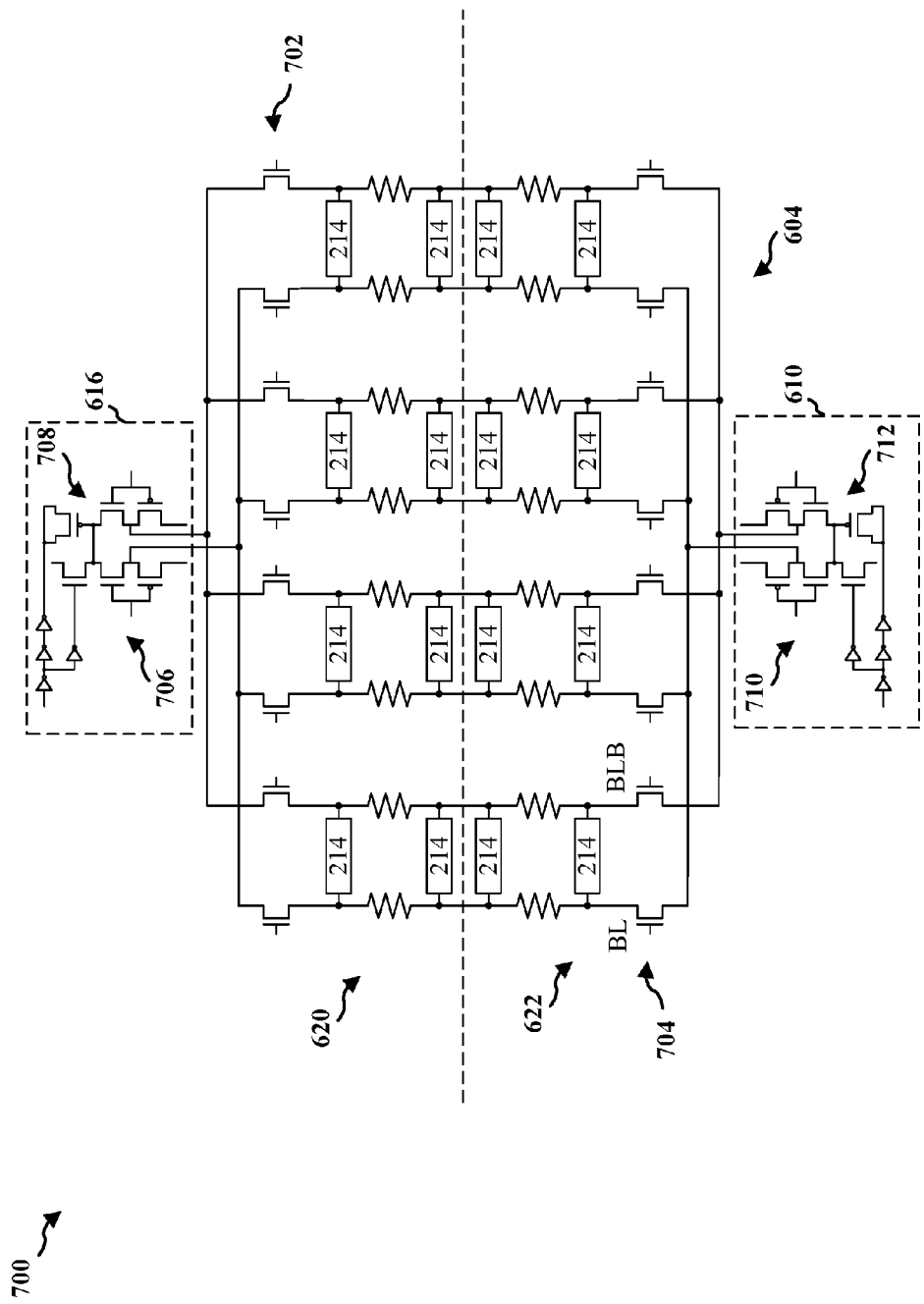
FIG. 7 illustrates various aspects of another example memory.

FIG. 7 illustrates various aspects of an example memory 700 including boost logic within write and boost logic 610, 616. In the example memory 700, the boost logic may be implemented at both ends of the bitlines (BL, BLB). Implementing the boost logic at both ends of the bitlines (BL, BLB) may shorten the signal path between an individual memory cell 214 in the array of SRAM memory cells 604 and the boost logic within write and boost logic 610, 616.

Each cell of the array of SRAM memory cells 604 may be the same or similar to the memory cell 214 of FIG. 3. In other examples, the array of SRAM memory cells 604 may be 8T-SRAM cells, 9T-SRAM cells, or 10T-SRAM cells. The write and boost logic 610 may be within a write driver, such as the write driver 210 illustrated in FIG. 2.

The array of SRAM memory cells 604, e.g., memory cells 214, may use NBL. For NBL, a boost may be generated to an I/O circuit, e.g., a bitline BL, BLB, of the array of SRAM memory cells 604. The boost may be generated at either end of the memory 700. By generating the boost at either end of the memory 700, the resistive losses may be decreased because the distance traveled between the generation of the boost on the bitlines and the particular memory cell of the SRAM memory cells 214 being accessed may be decreased.

As illustrated in FIG. 7, the memory 700 may include a first set of transistors 702 and a second set of transistors 704, (e.g., a series of transistors connected in series between power connections). The first set of transistors 702 may allow the write and boost logic 616 to drive the bitlines (BL, BLB) during a write operation to the memory cells 214 in the portion 620. Conversely, the second set of transistors 704 may allow the write and boost logic 610 to drive the bitlines (BL, BLB) during a write operation to the memory cells 214 in the portion 622.

Thus, as illustrated in FIG. 7, the boost logic (within write and boost logic 610, 616) may be implemented at respective ends of the bitlines. For one portion 620 (e.g., an upper half) of the array of SRAM memory cells 604, the write and boost logic 616 will be active for a data write operation to the portion 620 of the array. For another portion 622 (e.g., a lower half) of the array of SRAM memory cells 604, the write and boost logic 610 will be active for a data write operation to the portion 622 of the array. Activating the write and boost logic 610 for the portion 622 of the array of SRAM memory cells 604 and activating the write and boost logic 616 for the portion 620 of the array of SRAM memory cells 604 may reduce the bitline resistance by approximately one half. The reduction by one-half may be due to a reduction in a distance from a farthest bit cell 422 accessed from write and boost logic being reduced by approximately one-half. Reducing the resistance of a bitline may also scale down the boost generation requirement proportionately and hence the boost capacitor size may be smaller because a smaller capacitance value may be used. Accordingly, the boost capacitors 612, 614 may be smaller in some examples.

The write and boost logic 610, 616 may provide an NBL. For example, each of a set of transistors 706, 708, 710, 712 may be configured to apply a negative voltage and a boosted voltage to a corresponding bitline. The write and boost logic 610 may include the set of transistors 710, 712. When the set of transistors 710 apply a negative voltage to the bitline attached to the set of transistors 710, the set of transistors 712 applies a boosted voltage to the bitline attached to the set of transistors 712. Conversely, when the set of transistors 712 apply a negative voltage to the bitline attached to the set of transistors 712, the set of transistors 710 applies a boosted voltage to the bitline attached to the set of transistors 710. The write and boost logic 610 may be used during a write operation to one portion 622 of the memory 700.

Similarly, the write and boost logic 616 may include the set of transistors 706, 708. When the set of transistors 706 apply a negative voltage to the bitline attached to the set of transistors 706, the set of transistors 708 applies a boosted voltage to the bitline attached to the set of transistors 708. Conversely, when the set of transistors 708 apply a negative voltage to the bitline attached to the set of transistors 708, the set of transistors 706 applies a boosted voltage to the bitline attached to the set of transistors 706. The write and boost logic 616 may be used to during a write operation to one portion 620 of the memory 700.

The example memory 600, 700 includes a memory core (e.g., the array of SRAM memory cells 604 in a single contiguous group) having a plurality of memory cells. The memory cells (214) of the memory core may be 6T-SRAM cells, 8T-SRAM cells, 9T-SRAM cells, 10T-SRAM cells, or other types of SRAM memory cells. A first write assist circuit 626 (e.g., boost capacitor 614, write and boost logic 616, and write multiplexer 618) is configured to assist writing during a write operation to a first group of the memory cells (e.g., the portion 620). A second write assist circuit 628 is configured to assist writing during a write operation to a second group of the memory cells (e.g., the portion 622). The first write assist circuit 626 and the second write assist circuit 628 may be located on opposite sides of the memory core (e.g., the array of SRAM memory cells 604). A first edge circuit or edge cell (e.g., edge cell 602) may be between the first write assist circuit 626 and the memory core (e.g., the array of SRAM memory cells 604) and a second edge circuit or edge cell (e.g., edge cells 606) may be between the second write assist circuit 628 (e.g., boost capacitor 612, write and boost logic 610, and write multiplexer 608) and the memory core (e.g., the array of SRAM memory cells 604), as illustrated in FIG. 6.

In an example, one or more of the memory cells from the first group (e.g., portion 620) and one or more of the memory cells from the second group (e.g., portion 622) may be arranged in a column 250.

In an example, a bitline may be operatively coupled to each of the memory cells in the column 250.

In an example, the first write assist circuit 626 (e.g., boost capacitor 614, write and boost logic 616, and write multiplexer 618) and the second write assist circuit 628 (e.g., boost capacitor 612, write and boost logic 610, and write multiplexer 608) are operatively coupled to the bitline.

In an example, the first write assist circuit 626 may be configured to boost voltage applied to the bitline to write to one of the one or more memory cells from the first group (portion 620) and the second write assist circuit 628 is configured to boost voltage applied to the bitline to write to one of the one or more memory cells from the second group (portion 622).

In an example, the first write assist circuit 626 includes a first boost capacitor 614 configured to boost voltage applied to the bitline to write to one of the one or more memory cells from the first group (portion 620) and the second write assist circuit 628 includes a second boost capacitor 612 configured to boost voltage applied to the bitline to write to one of the one or more memory cells from the second group (portion 622).

An example may include a row decoder 204 configured to activate one of the memory cells 214 in the column and enable one of the first write assist circuit 626 (e.g., boost capacitor 614, write and boost logic 616, and write multiplexer 618) and the second write assist circuit 628 (e.g., boost capacitor 612, write and boost logic 610, and write multiplexer 608) to assist writing during a write operation to the activated one of the memory cells, e.g., in the array of SRAM memory cells 604.

An apparatus (e.g., processing system 100) may include at least one processor (102). The apparatus may also include a memory array (104, 600). The memory array (104, 600) includes a memory core (604) having a plurality of memory cells (214). A first write assist circuit (626) may be configured to assist writing to a first group (620) of the plurality of memory cells of the memory core (604). A second write assist circuit (628) may be configured to assist writing to a second group (622) of the plurality of memory cells (214) of the memory core (604).

In an example, the first write assist circuit (626) and the second write assist circuit (628) may be located on opposite sides of the memory core (604). A first edge cell (602) may be between the first write assist circuit (626) and the memory core (604) and a second edge cell (606) may be between the second write assist circuit (628) and the memory core (604).

One or more of the memory cells (214) from the first group (620) and one or more of the memory cells (214) from the second group (622) are arranged in a column (250). A bitline (BL-a, BL-b) operatively coupled to each of the memory cells (214) in the column (250).

In an example, the first write assist circuit (626) and the second write assist circuit (628) are operatively coupled to the bitline (BL-a, BL-b).

In an example, the first write assist circuit (626) may be configured to boost voltage applied to the bitline (BL-a, BL-b) to write to one of the one or more memory cells (214) from the first group (620) and the second write assist circuit (628) may be configured to boost voltage applied to the bitline (BL-a, BL-b) to write to one of the one or more memory cells (214) from the second group (622).

In an example, the first write assist circuit (626) may include a first boost capacitor (614) configured to boost voltage applied to the bitline (BL-a, BL-b) to write to one of the one or more memory cells (214) from the first group (620) and the second write assist circuit (628) may include a second boost capacitor (612) configured to boost voltage applied to the bitline to write to one of the one or more memory cells (214) from the second group (622).

In an example, a row decoder (204) may be configured to activate one of the memory cells (214) in the column (250) and enable one of the first write assist circuit (626) and second write assist circuit (628) to assist writing to the activated one of the memory cells (214).

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A memory, comprising:
    a memory core having a plurality of memory cells;
    a first write assist circuit including write and boost logic, the first write assist configured to assist writing to a first group of the plurality of memory cells of the memory core; and
    a second write assist circuit including write and boost logic, the second write assist configured to assist writing to a second group of the plurality of memory cells of the memory core,
    wherein the first write assist circuit and the second write assist circuit are located on opposite sides of the memory core and wherein the first write assist circuit and the second write assist circuit are operatively coupled to a bitline, the first write assist circuit configured to boost voltage applied to the bitline to write to one of the plurality of memory cells from the first group and the second write assist circuit configured to boost voltage applied to the bitline to write to the one of the plurality of memory cells from the second group.

2. The memory of claim 1, wherein a first edge cell is between the first write assist circuit and the memory core and a second edge cell is between the second write assist circuit and the memory core.

3. The memory of claim 1, wherein one or more of the memory cells from the first group and one or more of the memory cells from the second group are arranged in a column.

4. The memory of claim 3, further comprising a bitline operatively coupled to each of the memory cells in the column.

5. The memory of claim 1, wherein the first write assist circuit comprises a first boost capacitor configured to boost voltage applied to the bitline to write to one of the plurality of memory cells from the first group and the second write assist circuit comprises a second boost capacitor configured to boost voltage applied to the bitline to write to one of the plurality of memory cells from the second group.

6. The memory of claim 1, further comprising a row decoder configured to activate one of the memory cells in the column and enable one of the first and second write assist circuits to assist writing to the activated one of the memory cells.

7. An apparatus, comprising:
at least one processor;
a memory array including:
a memory core having a plurality of memory cells;
a first write assist circuit including write and boost logic, the first write assist configured to assist writing to a first group of the plurality of memory cells of the memory core; and
a second write assist circuit including write and boost logic, the second write assist configured to assist writing to a second group of the plurality of memory cells of the memory core,
wherein the first write assist circuit and the second write assist circuit are located on opposite sides of the memory core and wherein the first write assist circuit and the second write assist circuit are operatively coupled to a bitline, the first write assist circuit configured to boost voltage applied to the bitline to write to one of the plurality of memory cells from the first group and the second write assist circuit configured to boost voltage applied to the bitline to write to one of the plurality of memory cells from the second group.

8. The apparatus of claim 7, wherein a first edge cell is between the first write assist circuit and the memory core and a second edge cell is between the second write assist circuit and the memory core.

9. The apparatus of claim 7, wherein one or more of the memory cells from the first group and one or more of the memory cells from the second group are arranged in a column.

10. The apparatus of claim 9, further comprising a bitline operatively coupled to each of the memory cells in the column.

11. The apparatus of claim 7, wherein the first write assist circuit comprises a first boost capacitor configured to boost voltage applied to the bitline to write to one of the plurality of memory cells from the first group and the second write assist circuit comprises a second boost capacitor configured to boost voltage applied to the bitline to write to one of the plurality of memory cells from the second group.

12. The apparatus of claim 7, further comprising a row decoder configured to activate one of the memory cells in the column and enable one of the first and second write assist circuits to assist writing to the activated one of the memory cells.

13. An apparatus, comprising:
a memory array having a plurality of memory cells arranged in a plurality of columns;
first means for assisting writing to a first group of memory cells of the plurality of memory cells, the first means including write and boost logic; and
second means for assisting writing to a second group of memory cells of the plurality of memory cells, the second means including write and boost logic,
wherein the first group and the second group of memory cells share a pair of bitlines routed through the memory array, wherein the first means for assisting writing and the second means for assisting writing are located on opposite sides of the memory array and wherein the first means and the second means are operatively coupled to the pair of bitlines, the first write assist circuit configured to boost voltages applied to the pair of bitlines to write to one of the plurality of memory cells from the first group and the second write assist circuit configured to boost voltages applied to the pair of bitlines to write to one of the plurality of memory cells from the second group.

14. The apparatus of claim 13, wherein a first edge cell is between the first means for assisting writing and the memory array and a second edge cell is between the second means for assisting writing and the memory array.

15. The apparatus of claim 13, wherein one or more of the memory cells from the first group and one or more of the memory cells from the second group are arranged in a column.

16. The apparatus of claim 15, further comprising a bitline operatively coupled to each of the memory cells in the column.

* * * * *